(12) United States Patent
Bentley

(10) Patent No.: US 6,373,294 B1
(45) Date of Patent: Apr. 16, 2002

(54) MICROPROCESSOR STABILIZED FREQUENCY SOURCE AND METHOD FOR GENERATING A STABLE-FREQUENCY SIGNAL

(76) Inventor: Ronald Bentley, 4612 Rockmeadow Pl., Santa Rosa, CA (US) 95405

( * ) Notice: Subject to any disclaimer, the term of this patent is extended or adjusted under 35 U.S.C. 154(b) by 0 days.

(21) Appl. No.: 09/636,187

(22) Filed: Aug. 10, 2000

Related U.S. Application Data

(60) Provisional application No. 60/173,146, filed on Dec. 27, 1999.

(51) Int. Cl.$^7$ ............................................... H03B 21/00
(52) U.S. Cl. ...................... 327/106; 327/107; 327/119
(58) Field of Search .............................. 327/105–107, 327/116, 119–122

(56) References Cited

U.S. PATENT DOCUMENTS 5,126,699 A * 6/1992 Kabler ........................ 332/124
5,389,899 A * 2/1995 Yahagi et al. ................... 331/10
6,249,155 B1 * 6/2001 Hartman et al. ............. 327/107

* cited by examiner

Primary Examiner—Kenneth B. Wells
(74) Attorney, Agent, or Firm—Law Office of Donald D. Mondul

(57) ABSTRACT

An apparatus for generating a supply signal at a predetermined frequency comprises a digital synthesizer connected with an oscillator and a processor; and a temperature sensor connected with the processor. The oscillator provides a periodic excitation signal to the synthesizer, which responds by recurrently accumulating bits in quantum bit step amounts to a maximum bit capacity and returning to a starting bit count in a bit accumulating period. The synthesizer generates the supply signal based upon the bit accumulating period. The processor provides a control signal to the synthesizer to control the quantum bit step amount. The temperature sensor and the processor cooperatively employ a predetermined temperature parameter-correction factor relationship to adjust the control signal to set the quantum bit step amount to establish the bit accumulating period appropriately for the predetermined frequency. The method of the present invention comprises the steps of: (a) in no particular order: (1) providing a correlation base correlating a temperature indicator parameter with a correction factor, (2) providing a temperature sensor, (3) providing a processor; (b) sensing a parameter of ambient temperature; (c) generating the temperature indicator parameter appropriate for the parameter of ambient temperature sensed; (d) cooperatively operating the temperature sensor and the processor with the correlation base to determine a correction factor; and applying the correction factor to the synthesizer to affect the quantum bit change to alter the bit accumulating period appropriately to drive the synthesizer toward generating the source signal at the predetermined frequency.

17 Claims, 5 Drawing Sheets

MICROPROCESSOR STABILIZED FREQUENCY SOURCE AND METHOD FOR GENERATING A STABLE-FREQUENCY SIGNAL

This application claims benefit of prior filed copending Provisional Patent Application Ser. No. 60/173,146, filed Dec. 27, 1999.

BACKGROUND OF THE INVENTION

The present invention is directed to signal sources, and especially to frequency sources generating stable frequency signals across a variety of ambient temperature conditions.

Signal generators designed to generate stable-frequency source, or supply, signals are known. Analog devices, such as crystal oscillators, used in such stable-frequency signal generators render such devices susceptible to variance in output frequency, especially in response to changes in ambient temperature. Prior art stable-frequency signal generators employ expensive oscillator circuitry, insulated circuit modules, temperature compensating circuitry, and other additional packaging or circuitry to seek to generate stable-frequency signals over a range of ambient temperatures. Such compensating packaging, or circuitry, or both are expensive and sometimes bulky. In these times of market pressures to reduce cost and size of electronic components, both results are undesirable.

There is a need for a stable-frequency signal generator, which is inexpensive and not burdened with additional bulk or cost because of insulating packaging or temperature-compensating circuitry.

SUMMARY OF THE INVENTION

An apparatus for generating a supply signal at a predetermined frequency comprises a digital synthesizer connected with an oscillator and a processor; and a temperature sensor connected with the processor. The oscillator provides a periodic excitation signal to the synthesizer, which responds by recurrently accumulating bits in quantum bit step amounts to a maximum bit capacity and returning to a starting bit count in a bit accumulating period. The synthesizer generates the supply signal based upon the bit accumulating period. The processor provides a control signal to the synthesizer to control the quantum bit step amount. The temperature sensor and the processor cooperatively employ a predetermined temperature parameter-correction factor relationship to adjust the control signal to set the quantum bit step amount to establish the bit accumulating period appropriately for the predetermined frequency. The method of the present invention comprises the steps of: (a) in no particular order: (1) providing a correlation base correlating a temperature indicator parameter with a correction factor, (2) providing a temperature sensor, (3) providing a processor; (b) sensing a parameter of ambient temperature; (c) generating the temperature indicator parameter appropriate for the parameter of ambient temperature sensed; (d) cooperatively operating the temperature sensor and the processor with the correlation base to determine a correction factor; and applying the correction factor to the synthesizer to affect the quantum bit change to alter the bit accumulating period appropriately to drive the synthesizer toward generating the source signal at the predetermined frequency.

The correlation base may take any form which reliably relates a parameter associated with ambient temperature with a correction factor to be applied for driving the signal synthesizer toward generating a signal at a predetermined frequency. For example, the correlation base may be a table enabling one to enter with the parameter related to ambient temperature and determine the appropriate correction factor. Another form of correlation base may be an algorithmic relation between the parameter related to ambient temperature and a correction factor, with the correction factor expressed as a function of the parameter measured. Other forms of correlation base may easily be applied for use with the present invention and are within the scope of the invention.

The temperature sensor may be connected with the processor via a weighted combining device, which may also receive an input signal from the oscillator. The weighted combining device may then weightingly combine signals from the temperature sensor and the oscillator to produce a weighted indicator of the parameter associated with ambient temperature. This is a useful alternate embodiment because oscillators are affected by temperature change. That change provides another indicator of a parameter associated with temperature independent of the temperature sensor. Properly recognizing the temperature—to—change relation associated with the oscillator, and properly weighting it with respect to the output received from the temperature sensor, can increase accuracy and reliability of temperature-related information provided to the processor.

Another benefit of either embodiment described—with or without weighted combined signaling—is that the present invention provides an on-board indication of ambient temperature which may be used elsewhere in a product or system using the present invention. Often products may beneficially use such ambient temperature information, but cannot have it available without additional circuitry to provide it. Increased cost and size resulting from providing such additional circuitry dictates against such features. Employing the present invention for source signal stabilization provides the added benefit of such on-board temperature information "cost free". Such temperature information may be provided, for example, for such activities as temperature alarms, interrupts or similar functions. The processor of the present invention could, for example, be interrogated by other systems in a product for temperature information which may be employed in a myriad of ways. The point is that such on-board temperature information has not previously been available in calibrated form without prohibitively expensive additional circuitry provided for no other purpose than to provide such information. With the present invention, such calibrated temperature information is available relatively "cost-free"; no significant additional circuitry is required to enjoy the availability of such temperature information. It is a "two birds with one stone" result that makes for good engineering.

Yet another benefit of employing the present invention in a product is that any derivative clocks based upon the clock signal stabilized using the present invention will also be stabilized. Further, a system clock in a product, or system, can support multiple signal synthesizing devices, such as the digital synthesizing device employed in the preferred embodiment of the present invention. Yet there only needs to be one temperature sensor and one processor to stabilize all of the on-board signal generating devices of a system.

A still further additional benefit of employing the present invention in a product or system is that compensated clock information yielded by the present invention can be available to other functions within the product or system. Such a stable clock signal would likely be useful for hardware or software timing function.

The invention may also further include an additional correlation capability reflecting the effect of aging upon the apparatus. Thus, there may be a facility for storing an initial date and for determining a present date—or some other means for determining elapsed time—and an age-related correlation base for determining an age-compensating correction factor to the signal synthesizer. The age-related correlation base may also take on any format relating elapsed time with an appropriate correction factor and remain within the scope of the present invention.

It is, therefore, an object of the present invention to provide an apparatus for providing a source signal at a predetermined frequency which is inexpensive to produce.

It is a further object of the present invention to provide an apparatus for providing a source signal at a predetermined frequency which requires no special packaging or insulation.

It is yet a further object of the present invention to provide an apparatus for providing a source signal at a predetermined frequency which does not require temperature-compensating circuitry.

It is a still further object of the present invention to produce a method for generating a frequency-stable signal which does not rely upon special packaging or temperature-compensating circuitry associated with an oscillator device.

Further objects and features of the present invention will be apparent from the following specification and claims when considered in connection with the accompanying drawings, in which like elements are labeled using like reference numerals in the various figures, illustrating the preferred embodiments of the invention.

DETAILED DESCRIPTION OF THE PREFERRED EMBODIMENT

Figure 1:
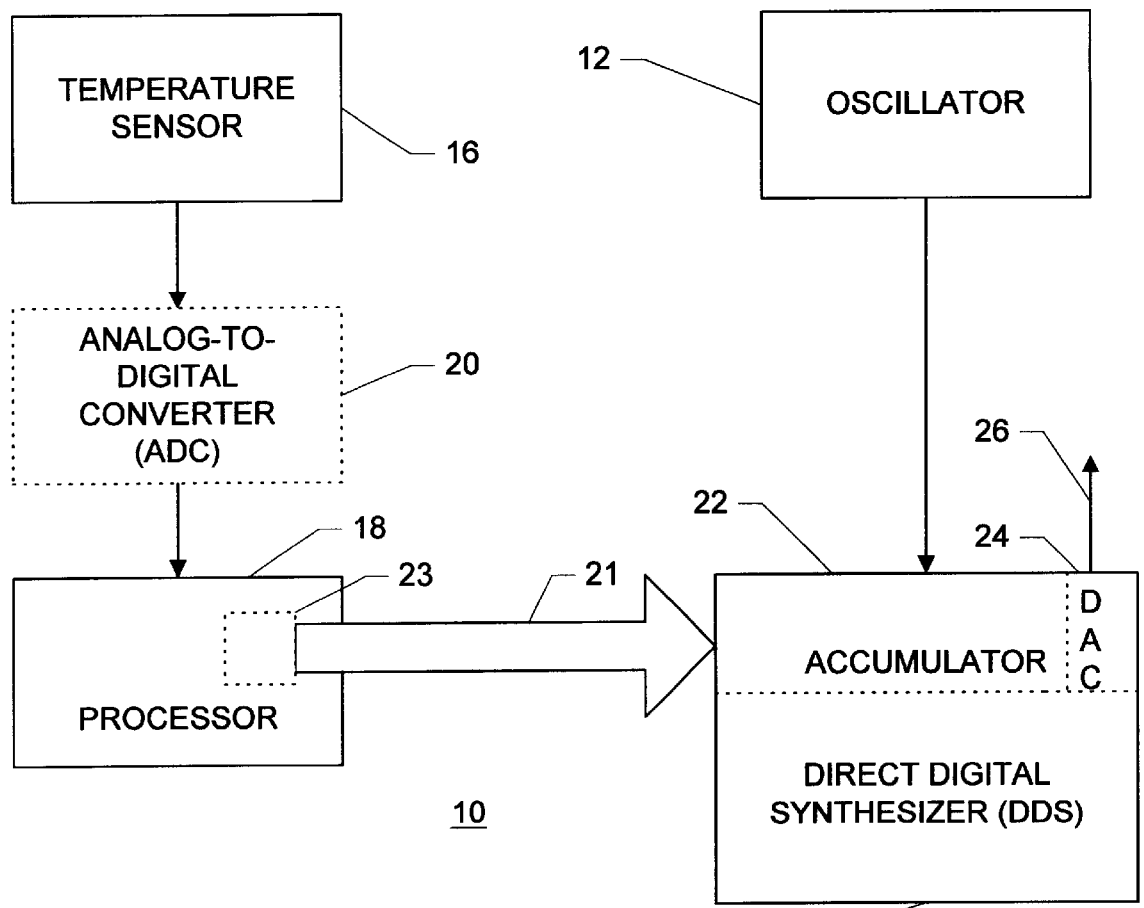
FIG. 1 is a schematic block diagram illustrating the preferred embodiment of the present invention.

FIG. 1 is a schematic block diagram illustrating the preferred embodiment of the present invention. In FIG. 1, a signal generating apparatus 10 includes an oscillator 12, a digital synthesizer 14, a temperature sensor 16, and a processor 18. An analog-to-digital converter 20 is represented using dotted lines to indicate that it usually is included in one of the temperature sensor 16 or the processor 18. In the preferred embodiment of the present invention, analog-to-digital converter 20 is included in processor 18.

Oscillator 12 is preferably a crystal oscillator. Processor 18 may be any processing device; the preferred embodiment of the present invention contemplates processor 18 being a microprocessor.

Digital synthesizer 14 is preferably a direct digital synthesizer device. Accordingly, digital synthesizer 14 includes an accumulator 22 and a digital-to-analog converter 24.

Oscillator 12 produces a periodic signal output to digital synthesizer 14. The periodic output signal contains at least one recognizably repeating event, such as a positive or negative peak, which is detected by digital synthesizer 14 as an occasion to drive accumulator 22 to change a bit count. Accumulator 22 changes the bit count by an incremental quantum bit change on each occasion of bit count change in response to detecting the repeating event in the signal received from oscillator 12. The preferred embodiment of the present invention contemplates that all changes in bit count are increases in bit count. However, digital synthesizer 14 may be employed to effect a negative bit count change in certain circumstances, if desired.

Accumulator 22 has a maximum bit capacity, preferably much larger than would be attainable with one bit count change being effected upon each occurrence of the repeating event in the output signal received from oscillator 12. That is, there is an incremental quantum bit count change associated with each repeating event in the output signal received from oscillator 12, and after detecting a plurality of such repeating events accumulator 22 will exceed its maximum bit count. On exceeding its maximum bit count, accumulator 22 begins counting bits anew from a starting bit count (preferably, but not necessarily zero). Thus, accumulator 22 has a bit accumulating period for recurrently accumulating bits from its starting bit count to its maximum bit count and returning to its starting bit count. Digital synthesizer 14 produces a marker signal to digital-to-analog converter 24 when accumulator "overflows" its maximum bit count to return to its starting bit count. An analog output signal is produced at an output pin 26 by digital-to-analog converter 24 having a period which is dependent upon the bit accumulating period of accumulator 22.

Thus, the period of the analog output signal from digital-to-analog converter 24 is dependent upon the frequency at which marker signals are received from digital synthesizer 14, which is dependent upon the bit accumulating period of accumulator 22, which is in turn determined by the quantum bit change effected for each incremental quantum bit count change associated with detecting the repeating event of the output signal received by accumulator 22 from oscillator 12.

If the quantum bit count change is larger for each occurrence of the repeating event, then the bit accumulating period for accumulator 22 will be shorter because the maximum bit count of accumulator 22 will be reached sooner, on fewer occasions of the repeating event. In such circumstances, the period of the analog output signal presented at output pin 26 from digital-to-analog converter 24 will be shorter, and the frequency of the analog signal will be higher. On the other hand, if the quantum bit count change is smaller for each occurrence of the repeating event, then the bit accumulating period for accumulator 22 will be longer. In such circumstances, the period of the analog output signal presented at output pin 26 from digital-to-analog converter 24 will be longer, and the frequency of the analog signal will be lower.

Processor 18 is connected to control the quantum bit count change of accumulator 22, as indicated by arrow 21. Thus, processor 18 controls the frequency of the analog output signal from digital-to-analog converter 24 presented at output pin 26 of signal generating apparatus 10.

Temperature sensor 16 senses at least one parameter associated with ambient temperature of the situs of operation of signal generating apparatus 10. Parameters which may be employed for operation of signal generating apparatus 10 include, for example, temperature, change in temperature, or rate of change of temperature. The preferred parameter for operation of signal generating apparatus 10 is change of temperature. By relying upon sensing change of temperature, a requirement that temperature be sensed accurately in absolute terms is avoided. It is merely necessary that excursions of temperature from an arbitrary value be known. Sensing excursionary variances from the known value may be effected without any need for calibration to ensure that a correct temperature parameter is obtained for use by the invention.

Contained in or available to signal generating apparatus 10 is a correlation base 23. Preferably, but not necessarily, correlation base 23 is contained within processor 18. Correlation base 23 may be in any appropriate form or format desired, so long as one can correlate the parameter associated with ambient temperature sensed by temperature sensor 16 and provided to processor 18 with an appropriate correction factor. The correction factor is appropriate when it drives accumulator 22 to effect a quantum bit count change of a value to set the bit accumulating period properly to cause the digital-to-analog converter 24 to generate an analog output signal at the predetermined frequency at output pin 26. Since digital synthesizer 14 is a digitally operating device, it is possible that processor 18 will establish a quantum bit count change in accumulator 22 appropriate to only approximate an analog output signal output pin 26 of the predetermined frequency. The higher the maximum bit capacity of accumulator 22, the greater the flexibility in choosing an appropriate quantum bit count change to more closely approximate the desired frequency in an analog output signal at output pin 26. In practice, processor 18 issues a correction factor to accumulator 22 based upon correlation base 23 to drive digital synthesizer 14 toward generating an analog output signal at output pin 26 at the desired frequency. As temperature changes, and as digital inaccuracies in approximation of analog events compound, signal generating apparatus 10 may "hunt" about the desired frequency in its analog output signal. The variance experienced during such hunting will be affected by the maximum bit capacity of accumulator 22, and by the number of bits in each quantum step of the quantum bit count change. A higher maximum bit capacity in accumulator 22 allows for finer resolution in quantum bit count changes and is manifested in less error in output signal frequency. Thus, a higher maximum bit capacity of accumulator 22 is manifested by less "hunting" amplitude in the analog output signal at output pin 26.

Figure 2:
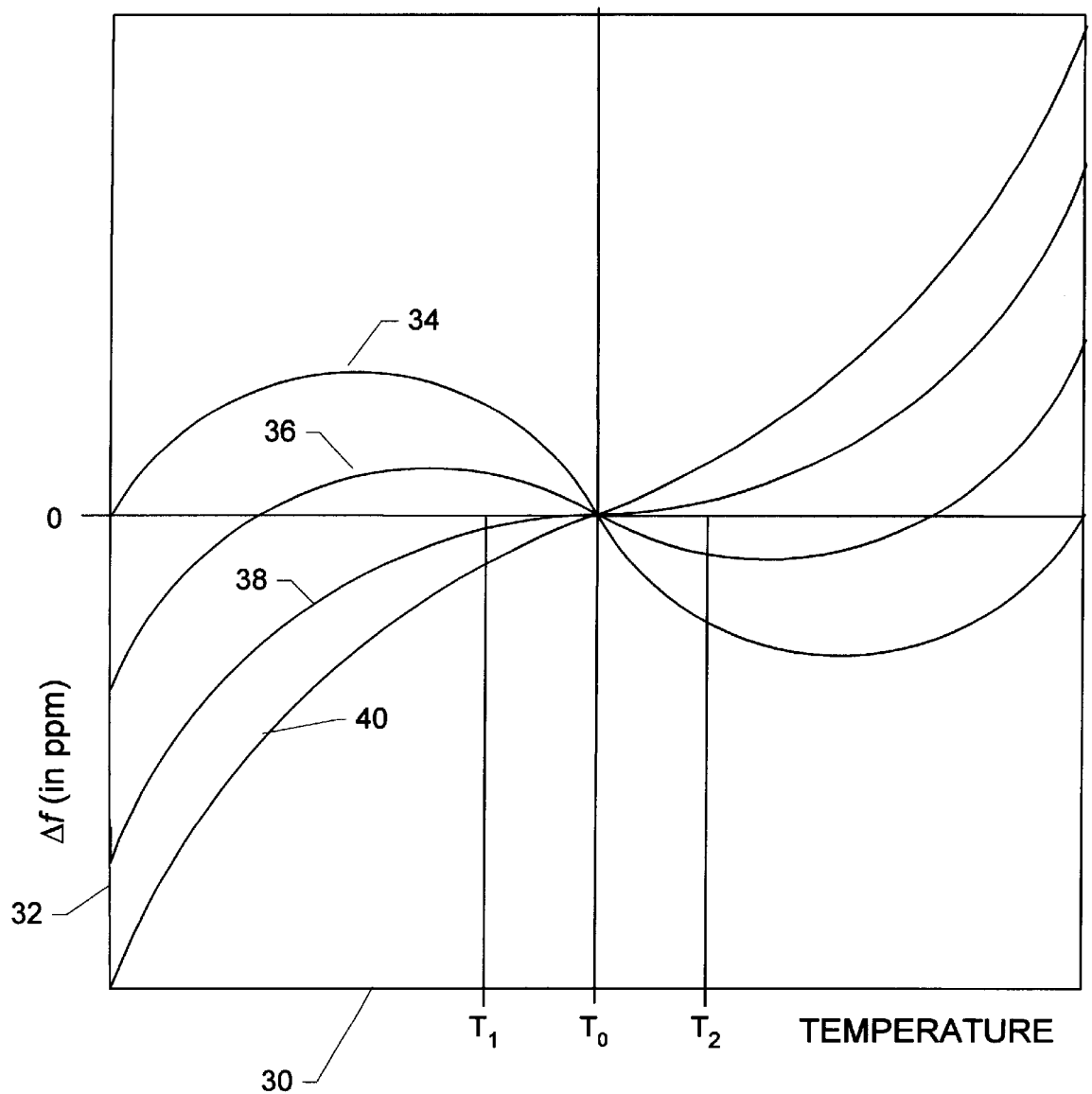
FIG. 2 is a graph representing a relationship of frequency variance as a function of temperature for a variety of plane-angle cuts of a quartz crystal.

FIG. 2 is a graph representing a relationship of frequency variance as a function of temperature for a variety of plane-angle cuts of a quartz crystal. In FIG. 2, a horizontal axis 30 measures temperature (T), and a vertical axis 32 measures change in frequency in parts per million (Δf in ppm) as a function of temperature. A plurality of curves 34, 36, 38, 40 are plotted on axes 30, 32 representing the relationship between Δf and T for different planar cuts of a crystal. Inspection of FIG. 2 reveals that curve 38 represents the least change in Δf of the various curves 34, 36, 38, 40 over a temperature range $T_1-T_2$. It is such information relating to a given crystal that can aid in selecting which planar cut of which crystal is best for a given ambient temperature operating range.

Figure 3:
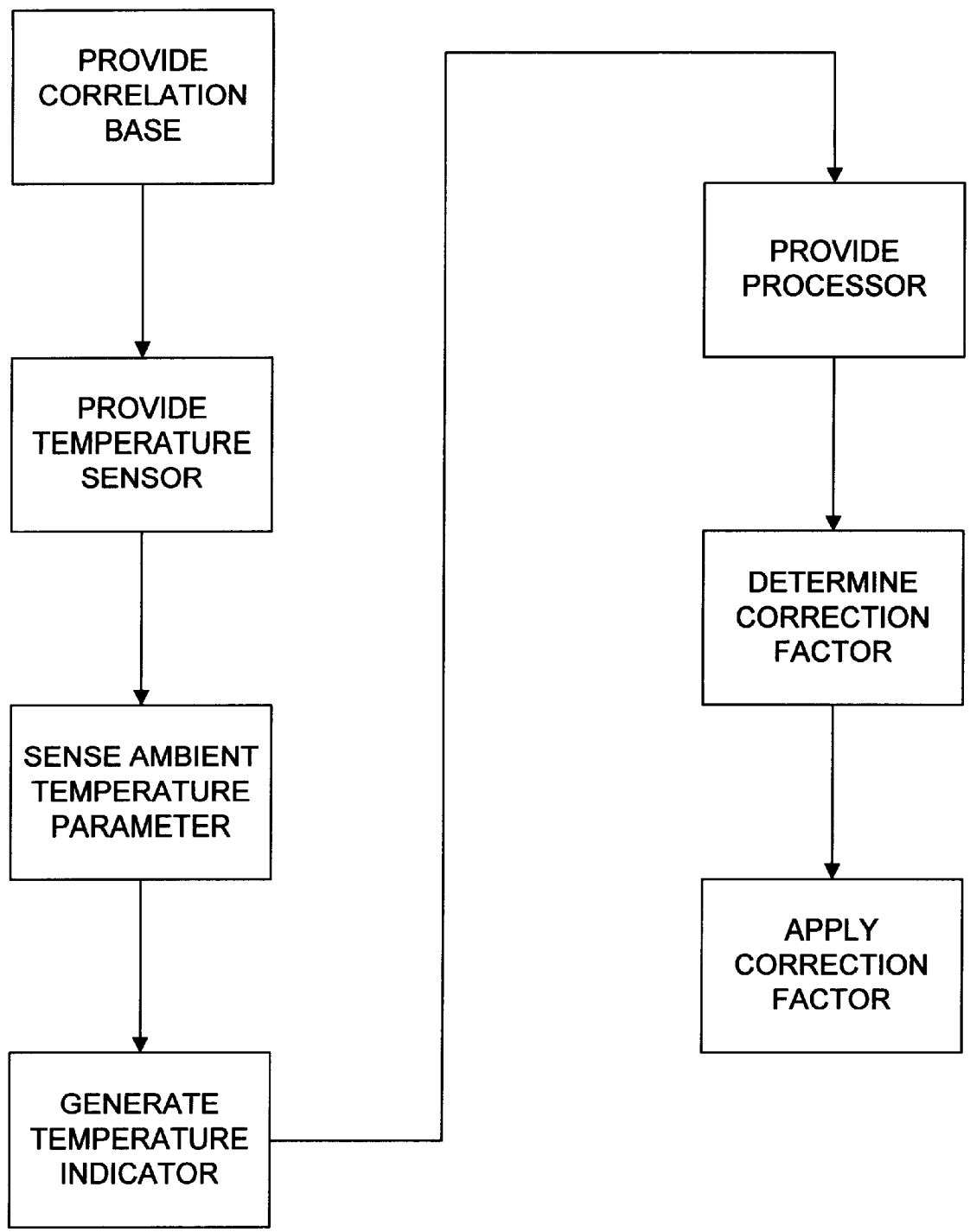
FIG. 3 is a graph representing a relationship of frequency drift as a function of temperature for one of the curves plotted in FIG. 2.

FIG. 3 is a graph representing a relationship of frequency drift as a function of temperature for one of the curves plotted in FIG. 2. In FIG. 3, a horizontal axis 44 measures temperature (T), and a vertical axis 46 measures frequency drift in parts per million (ppm). A curve 48 is plotted on axes 44, 46 representing the relationship between frequency drift and T for one of planar cuts of the crystal illustrated in FIG. 2. The curves in FIGS. 2 and 3 are not to scale; they are intended to illustrate that the relationships may be plotted and may be described mathematically. That is, by collecting such information (by way of example) as is illustrated in FIGS. 2 and 3, one can construct a correlation base of the sort contemplated for employment with the present invention. Any expression of a relationship between frequency output of a crystal (or other oscillator device) as it related to changes in temperature may be the basis upon which decisions may be made by processor 18 (FIG. 1) regarding what size quantum bit increase to order for accumulator 22 to use in responding to detection of the repeatable event in the signal received from oscillator 12. The relationships in FIGS. 2 and 3 are graphic, but they could as well be expresses in tabular form, in algorithmic form, in the form of coefficients for an algorithm, or in other ways and still enjoy the benefits of the present invention. The form of expression of a correlation base is not restricted.

Figure 4:
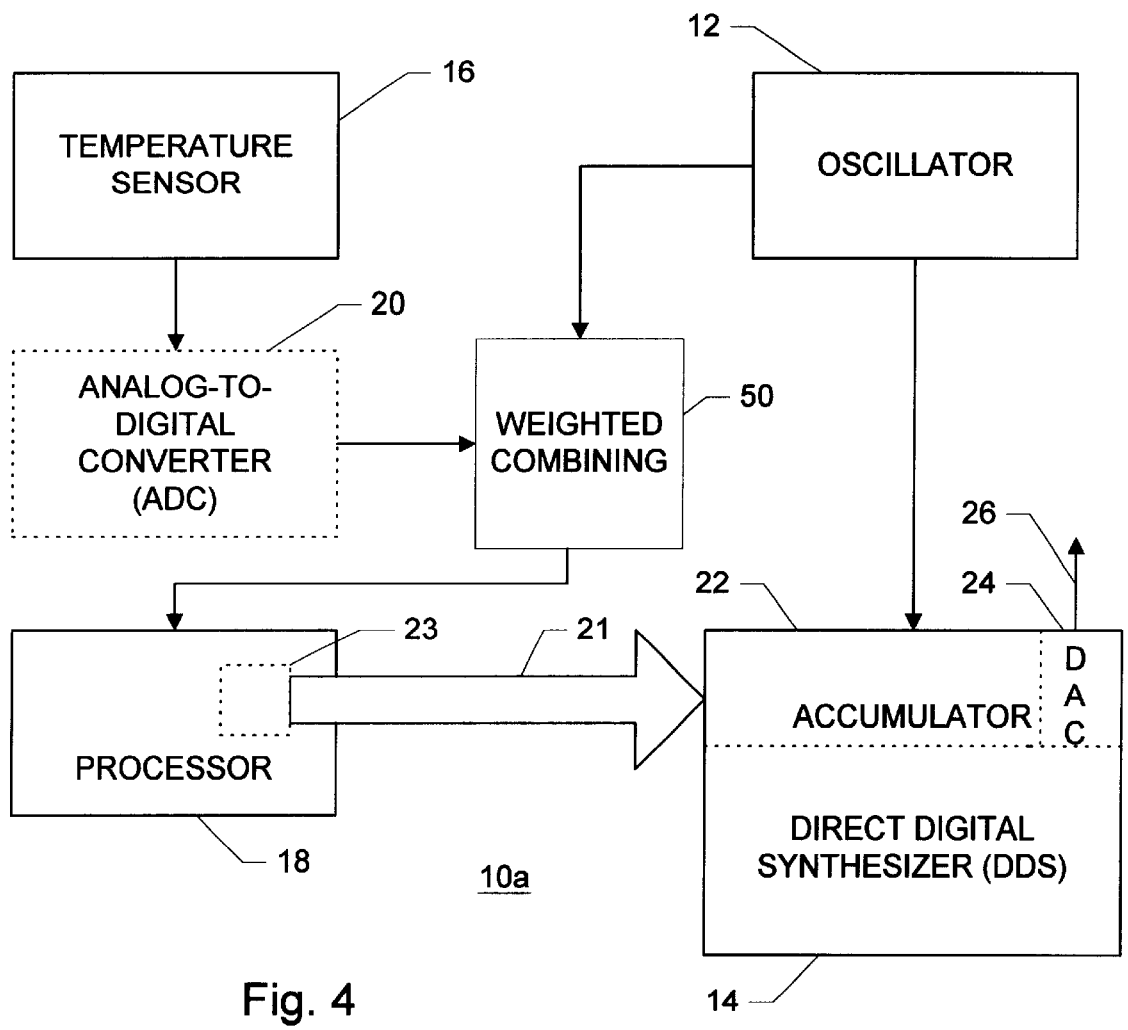
FIG. 4 is a schematic block diagram illustrating an alternate embodiment of the present invention.

FIG. 4 is a schematic block diagram illustrating an alternate embodiment of the present invention. In FIG. 4, a signal generating apparatus 10a includes an oscillator 12, a digital synthesizer 14, a temperature sensor 16, and a processor 18. Signal generating apparatus 10a is substantially the same construction as signal generating apparatus 10 (FIG. 1) in many respects. In the interest of avoiding prolixity, a detailed description of elements of signal generating apparatus 10a which are common with signal generating apparatus 10 will not be recited here.

A significant constructional departure of signal generating apparatus 10a from signal generating apparatus 10 (FIG. 1) is the inclusion of a weighted combining device 50, such as a Kalman filter. Weighted combining device 50 receives input signals from analog-to-digital converter 20 and from oscillator 12. Both types of devices—analog-to-digital converters and oscillators—are known to vary in their performance over temperature, but to differing degrees. That is, each of analog-to-digital converter 20 and oscillator 12 may indicate change in temperature by providing a measured parameter associated with them. Taking two such independent sources of information regarding temperature variation, rather than only one of those sources, can provide more accurate temperature variance information. The value of such temperature variance information depends upon one properly weighting the indicator signals received from each of the temperature variance signal sources. Accordingly, analog-to-digital converter 20 provides a temperature variance signal to weighted combining device 50, and oscillator 12 provides a temperature variance signal to weighted combining device 50. Weighted combining device 50 weightedly combines the temperature variance signals received from analog-to-digital converter 20 and oscillator 12 to provide a weighted temperature variance signal to processor 18.

Other aspects of operation and construction of signal generating apparatus 10a are substantially the same as operation and construction of signal generating apparatus 10, described above in connection with FIG. 1, and will not be repeated here.

Figure 5:
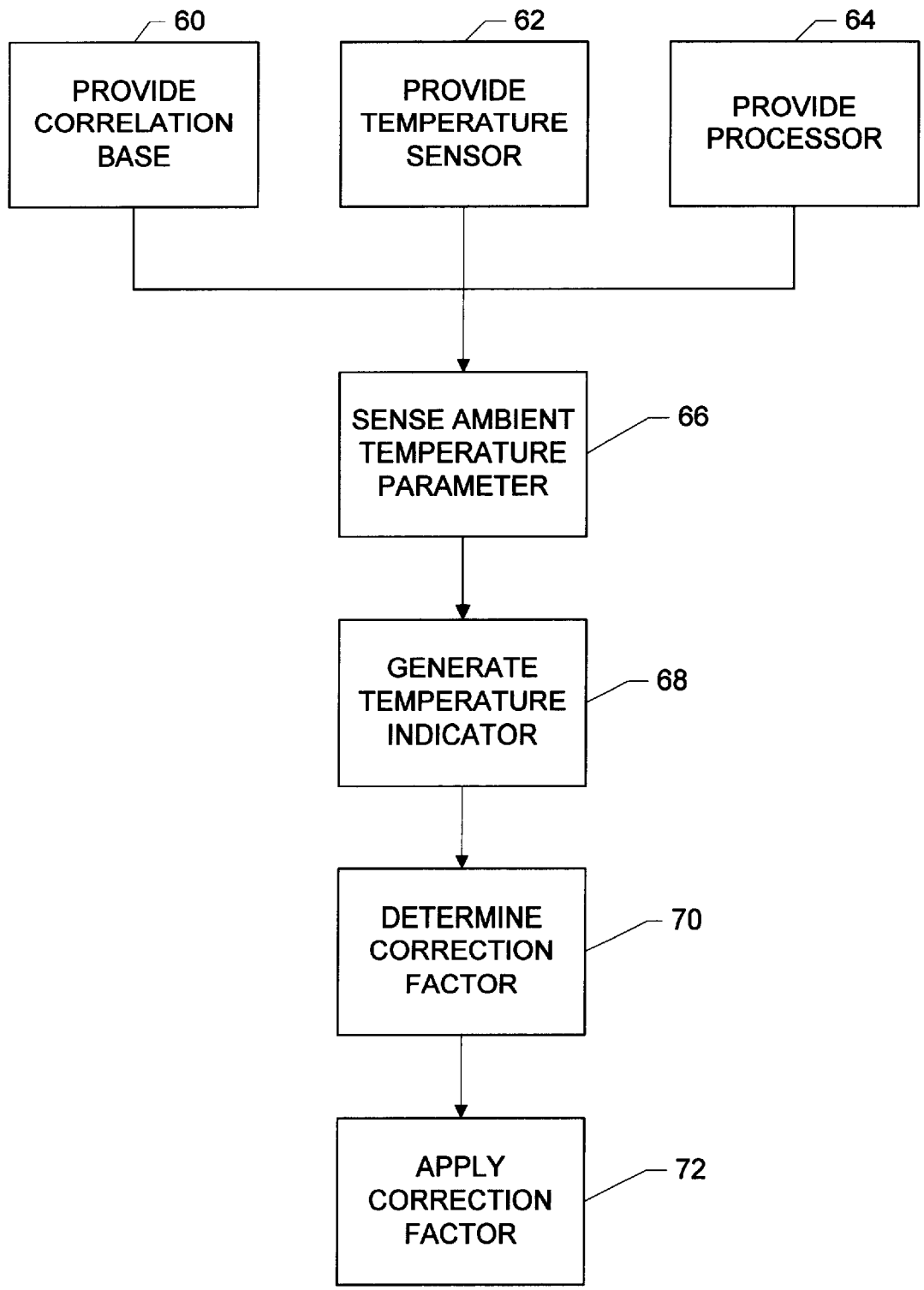
FIG. 5 is a schematic flow chart illustrating the method of the present invention.

FIG. 5 is a schematic flow chart illustrating the method of the present invention. In FIG. 5, a method is illustrated for controlling the accumulating period of an accumulator to generate a source signal at a predetermined frequency. The method is employed in an apparatus, such as signal generating apparatus 10 (FIG. 1), for generating a source signal at a predetermined frequency. The apparatus has an oscillator, or signal generating device, which provides a periodic signal to a signal synthesizing device. The signal synthesizing device includes an accumulating device having a maximum bit capacity; the accumulating device recurrently accumulates bits to the maximum bit capacity and returns to a starting bit count (preferably zero) in a bit accumulating period. The recurrent accumulating is effected by a periodic incremental quantum bit change in response to at least one repeating event contained in the periodic signal received by the accumulator from the oscillator. The signal synthesizing device generates the source signal based upon the bit accumulating period of the accumulator. The method begins with providing, in no particular order, a correlation base, as indicated by a block 60 in FIG. 5; a temperature sensor, as indicated by a block 62; and a processor, as indicated by a block 64.

The correlation base correlates a temperature indicator parameter with a correction factor. The correlation base may take any form—for example, a tabular format, an algorithmic form, or an array of coefficients in an algorithmic relationship—so long as the correlation base serves to correlate a parameter associated with ambient temperature with an appropriate correction factor.

The processor provided according to the step represented by block 64 is preferably a microprocessor, and preferably will contain the correlation base provided according to the step represented by block 60.

The temperature sensor provided according to the step represented by block 62 is used to effect the next step: to sense a parameter of ambient temperature, as indicated by a block 66. The parameter sensed in effecting this step may be, for example, temperature, change of temperature, or rate of change of temperature. Which particular parameter sensed is only important in so far as it is relatable to a correction factor to be sent to the accumulating device to drive the associated signal synthesizing device toward producing the source signal at the desired predetermined frequency.

The method continues with generating a temperature indicator, as indicated by a block 68. This step contemplates generating a temperature indicator for entry into the correlation base provided according to the step represented by block 60. One example of such a temperature indicator may be the very parameter sensed in accordance with the step represented by block 66 above. Another example of a temperature indicator appropriate to performing the step represented by block 68 is change of temperature, or rate of change of temperature over a time interval. Such indicators could be calculated, for example, from observed ambient temperature measurements effected according to block 66. Which particular temperature indicator is generated according to the method step represented by block 68 is only important in so far as it is the entry parameter for using the correlation base for determining an appropriate correction factor to be issued to the accumulator.

The method continues with a step involving cooperatively operating the temperature sensor and the processor with the correlation base provided according to the step represented by block 60 to determine a correction factor, as indicated by a block 70. The correction factor is appropriate for issue by the processor to the accumulating device to drive the signal synthesizing device toward generating the source signal at the predetermined frequency.

The method continues with the step of applying the correction factor to the signal synthesizing device to affect the quantum bit change to alter the bit accumulating period appropriately to drive the signal synthesizing device toward generating the source signal at the predetermined frequency, as indicated by a block 72.

It is to be understood that, while the detailed drawings and specific examples given describe preferred embodiments of the invention, they are for the purpose of illustration only, that the apparatus and method of the invention are not limited to the precise details and conditions disclosed and that various changes may be made therein without departing from the spirit of the invention which is defined by the following claims:

What is claimed is:

1. An apparatus for providing a source signal at a predetermined frequency, the apparatus comprising:

(a) a signal generating device; said signal generating device providing a periodic signal;

(b) a signal synthesizing device; said signal synthesizing device being connected with said signal generating device; said signal synthesizing device including an accumulating device; said accumulating device having a maximum bit capacity; said accumulating device recurrently accumulating bits to said maximum bit capacity and returning to a starting bit count in a bit accumulating period; said recurrent accumulating being effected by a periodic incremental quantum change in said bits being accumulated in response to at least one repeating event contained in said periodic signal; said signal synthesizing device generating said source signal based upon said bit accumulating period;

(c) a processor device connected with said signal synthesizing device; said processor device issuing a correction signal to said signal synthesizing device to control said incremental quantum change; said processor device having a stored correlation base for correlation between a parameter of ambient temperature and said correction signal;

(d) a temperature sensing device for sensing said parameter of ambient temperature; said temperature sensing device being connected with said processor device; said temperature sensing device and said processor device cooperating to employ said parameter of ambient temperature with said correlation base to select an appropriate said correction signal to drive said signal synthesizing device toward generating said source signal at said predetermined frequency; said correlation base being a correlation table relating said parameter of ambient temperature change with said correction signal.

2. An apparatus for providing a source signal at a predetermined frequency, the apparatus comprising:

(a) a signal generating device; said signal generating device providing a periodic signal;

(b) a signal synthesizing device; said signal synthesizing device being connected with said signal generating device; said signal synthesizing device including an accumulating device; said accumulating device having a maximum bit capacity; said accumulating device recurrently accumulating bits to said maximum bit capacity and returning to a starting bit count in a bit accumulating period; said recurrent accumulating being effected by a periodic incremental quantum change in said bits being accumulated in response to at least one repeating event contained in said periodic signal; said signal synthesizing device generating said source signal based upon said bit accumulating period;

(c) a processor device connected with said signal synthesizing device; said processor device issuing a correction signal to said signal synthesizing device to control said incremental quantum change; said processor device having a stored correlation base for correlation between a parameter of ambient temperature and said correction signal;

(d) a temperature sensing device for sensing said parameter of ambient temperature; said temperature sensing device being connected with said processor device; said temperature sensing device and said processor device cooperating to employ said parameter of ambient temperature with said correlation base to select an appropriate said correction signal to drive said signal synthesizing device toward generating said source signal at said predetermined frequency; said correlation base being a correlation algorithmic relation defining said correction signal as a function of said parameter of ambient temperature.

3. An apparatus for providing a source signal at a predetermined frequency, the apparatus comprising:
   (a) a signal generating device; said signal generating device providing a periodic signal;
   (b) a signal synthesizing device; said signal synthesizing device being connected with said signal generating device; said signal synthesizing device including an accumulating device; said accumulating device having a maximum bit capacity; said accumulating device recurrently accumulating bits to said maximum bit capacity and returning to a starting bit count in a bit accumulating period; said recurrent accumulating being effected by a periodic incremental quantum change in said bits being accumulated in response to at least one repeating event contained in said periodic signal; said signal synthesizing device generating said source signal based upon said bit accumulating period;
   (c) a processor device connected with said signal synthesizing device; said processor device issuing a correction signal to said signal synthesizing device to control said incremental quantum change; said processor device having a stored correlation base for correlation between a parameter of ambient temperature and said correction signal;
   (d) a temperature sensing device for sensing said parameter of ambient temperature; said temperature sensing device being connected with said processor device; said temperature sensing device and said processor device cooperating to employ said parameter of ambient temperature with said correlation base to select an appropriate said correction signal to drive said signal synthesizing device toward generating said source signal at said predetermined frequency; said temperature sensing device being connected with said processing device via a weighted combining device; said weighted combining device also being connected with said signal generating device; said weighted combining device weightingly combining temperature-parameter-indicating signals from said temperature sensing device and said signal generating device to determine a weighted indicator of said parameter of ambient temperature for use with said correlation base in cooperation with said processor device.

4. An apparatus for providing a source signal at a predetermined frequency as recited in claim 3 wherein said processor device has a stored initial date and a date determining facility; said processor device having an age correlation base; said processor periodically employing said initial date and said date determining facility to determine an age parameter for employment with said age correlation base to aid in selecting an appropriate said correction signal to drive said signal synthesizing device toward generating said source signal at said predetermined frequency.

5. An apparatus for providing a source signal at a predetermined frequency as recited in claim 4 wherein said correlation base is a correlation table relating said parameter of ambient temperature change with said correction signal.

6. An apparatus for providing a source signal at a predetermined frequency as recited in claim 4 wherein said correlation base is a correlation algorithmic relation defining said correction signal as a function of said parameter of ambient temperature.

7. An apparatus for providing a source signal at a predetermined frequency, the apparatus comprising:
   (a) a signal generating device; said signal generating device providing a periodic signal;
   (b) a signal synthesizing device; said signal synthesizing device being connected with said signal generating device; said signal synthesizing device including an accumulating device; said accumulating device having a maximum bit capacity; said accumulating device recurrently accumulating bits to said maximum bit capacity and returning to a starting bit count in a bit accumulating period; said recurrent accumulating being effected by a periodic incremental quantum change in said bits being accumulated in response to at least one repeating event contained in said periodic signal; said signal synthesizing device generating said source signal based upon said bit accumulating period;
   (c) a processor device connected with said signal synthesizing device; said processor device issuing a correction signal to said signal synthesizing device to control said incremental quantum change; said processor device having a stored correlation base for correlation between a parameter of ambient temperature and said correction signal;
   (d) a temperature sensing device for sensing said parameter of ambient temperature; said temperature sensing device being connected with said processor device; said temperature sensing device and said processor device cooperating to employ said parameter of ambient temperature with said correlation base to select an appropriate said correction signal to drive said signal synthesizing device toward generating said source signal at said predetermined frequency; said processor device having a stored initial date and a date determining facility; said processor device having an age correlation base; said processor periodically employing said initial date and said date determining facility to determine an age parameter for employment with said age correlation base to aid in selecting an appropriate said correction signal to drive said signal synthesizing device toward generating said source signal at said predetermined frequency.

8. In an apparatus for generating a source signal at a predetermined frequency, said apparatus having a signal generating device and a signal synthesizing device, said signal generating device providing a periodic signal; said signal synthesizing device being connected with said signal generating device and including an accumulating device, said accumulating device having a maximum bit capacity, said accumulating device recurrently accumulating bits to said maximum bit capacity and returning to a starting bit count in a bit accumulating period, said recurrent accumulating being effected by a periodic incremental quantum change in said bits being accumulated in response to at least one repeating event contained in said periodic signal, said signal synthesizing device generating said source signal based upon said bit accumulating period; a method for controlling said accumulating period to generate said source signal at said predetermined frequency, the method comprising the steps of:

(a) in no particular order:
  (1) providing a correlation base correlating a temperature indicator parameter with a correction factor,
  (2) providing a temperature sensing device,
  (3) providing a processor device;

(b) sensing a parameter of ambient temperature;

(c) generating said temperature indicator parameter appropriate for said parameter of ambient temperature sensed;

(d) cooperatively operating said temperature sensing device and said processor device with said correlation base to determine a correction factor; and (e) applying said correction factor to said signal synthesizing device to effect said quantum change to alter said bit accumulating period appropriately to drive said signal synthesizing device toward generating said source signal at said predetermined frequency; said correlation base being a correlation table relating said parameter of ambient temperature change with said correction factor.

9. In an apparatus for generating a source signal at a predetermined frequency, said apparatus having a signal generating device and a signal synthesizing device, said signal generating device providing a periodic signal; said signal synthesizing device being connected with said signal generating device and including an accumulating device, said accumulating device having a maximum bit capacity, said accumulating device recurrently accumulating bits to said maximum bit capacity and returning to a starting bit count in a bit accumulating period, said recurrent accumulating being effected by a periodic incremental quantum change in said bits being accumulated in response to at least one repeating event contained in said periodic signal, said signal synthesizing device generating said source signal based upon said bit accumulating period; a method for controlling said accumulating period to generate said source signal at said predetermined frequency, the method comprising the steps of:

(a) in no particular order:
  (1) providing a correlation base correlating a temperature indicator parameter with a correction factor,
  (2) providing a temperature sensing device,
  (3) providing a processor device;

(b) sensing a parameter of ambient temperature;

(c) generating said temperature indicator parameter appropriate for said parameter of ambient temperature sensed;

(d) cooperatively operating said temperature sensing device and said processor device with said correlation base to determine a correction factor; and (e) applying said correction factor to said signal synthesizing device to effect said quantum change to alter said bit accumulating period appropriately to drive said signal synthesizing device toward generating said source signal at said predetermined frequency; said correlation base being a correlation algorithmic relation defining said correction factor as a function of said parameter of ambient temperature.

10. In an apparatus for generating a source signal at a predetermined frequency, said apparatus having a signal generating device and a signal synthesizing device, said signal generating device providing a periodic signal; said signal synthesizing device being connected with said signal generating device and including an accumulating device, said accumulating device having a maximum bit capacity, said accumulating device recurrently accumulating bits to said maximum bit capacity and returning to a starting bit count in a bit accumulating period, said recurrent accumulating being effected by a periodic incremental quantum change in said bits being accumulated in response to at least one repeating event contained in said periodic signal, said signal synthesizing device generating said source signal based upon said bit accumulating period; a method for controlling said accumulating period to generate said source signal at said predetermined frequency, the method comprising the steps of:

(a) in no particular order:
  (1) providing a correlation base correlating a temperature indicator parameter with a correction factor,
  (2) providing a temperature sensing device,
  (3) providing a processor device;

(b) sensing a parameter of ambient temperature;

(c) generating said temperature indicator parameter appropriate for said parameter of ambient temperature sensed;

(d) cooperatively operating said temperature sensing device and said processor device with said correlation base to determine a correction factor; and (e) applying said correction factor to said signal synthesizing device to effect said quantum change to alter said bit accumulating period appropriately to drive said signal synthesizing device toward generating said source signal at said predetermined frequency; said temperature sensing device being connected with said processing device via a weighted combining device; said weighted combining device also being connected with said signal generating device; said weighted combining device weightingly combining temperature-parameter-indicating signals from said temperature sensing device and said signal generating device to determine a weighted indicator of said parameter of ambient temperature for use with said correlation base in cooperation with said processor device.

11. In an apparatus for generating a source signal at a predetermined frequency, a method for controlling an accumulating period to generate said source signal at said predetermined frequency as recited in claim 10 wherein said processor device has a stored initial date and a date determining facility; said processor device having an age correlation base; said processor periodically employing said initial date and said date determining facility to determine an age parameter for employment with said age correlation base to aid in selecting an appropriate said correction signal to drive said signal synthesizing device toward generating said source signal at said predetermined frequency.

12. In an apparatus for generating a source signal at a predetermined frequency, a method for controlling an accumulating period to generate said source signal at said predetermined frequency as recited in claim 10 wherein said correlation base is a correlation table relating said parameter of ambient temperature change with said correction factor.

13. In an apparatus for generating a source signal at a predetermined frequency, a method for controlling an accumulating period to generate said source signal at said predetermined frequency as recited in claim 10 wherein said correlation base is a correlation algorithmic relation defining said correction factor as a function of said parameter of ambient temperature.

14. In an apparatus for generating a source signal at a predetermined frequency, said apparatus having a signal generating device and a signal synthesizing device, said signal generating device providing a periodic signal; said signal synthesizing device being connected with said signal generating device and including an accumulating device, said accumulating device having a maximum bit capacity, said accumulating device recurrently accumulating bits to said maximum bit capacity and returning to a starting bit count in a bit accumulating period, said recurrent accumulating being effected by a periodic incremental quantum change in said bits being accumulated in response to at least one repeating event contained in said periodic signal, said signal synthesizing device generating said source signal based upon said bit accumulating period; a method for controlling said accumulating period to generate said source signal at said predetermined frequency, the method comprising the steps of:

(a) in no particular order:
  (1) providing a correlation base correlating a temperature indicator parameter with a correction factor,
  (2) providing a temperature sensing device,
  (3) providing a processor device;
(b) sensing a parameter of ambient temperature;
(c) generating said temperature indicator parameter appropriate for said parameter of ambient temperature sensed;
(d) cooperatively operating said temperature sensing device and said processor device with said correlation base to determine a correction factor; and
(e) applying said correction factor to said signal synthesizing device to effect said quantum change to alter said bit accumulating period appropriately to drive said signal synthesizing device toward generating said source signal at said predetermined frequency; said processor device having a stored initial date and a date determining facility; said processor device having an age correlation base; said processor periodically employing said initial date and said date determining facility to determine an age parameter for employment with said age correlation base to aid in selecting an appropriate said correction signal to drive said signal synthesizing device toward generating said source signal at said predetermined frequency.

15. An apparatus for generating a supply signal at a predetermined frequency, the apparatus comprising:

a digital synthesizing device;

an oscillator device connected with said digital synthesizer device;

a processing device connected with said digital synthesizer device; and a temperature sensing device connected with said processing device;

said oscillator device being connected with said digital synthesizing device and providing a periodic excitation signal to said digital synthesizing device; said digital synthesizing device responding to said excitation signal by recurrently accumulating bits in an accumulator device in quantum bit step amounts to a maximum bit capacity and returning to a starting bit count in a bit accumulating period; said digital synthesizing device generating said supply signal based upon said bit accumulating period; said processing device providing a control signal to said digital synthesizing device to control said quantum bit step amount; said temperature sensing device and said processor device cooperatively employing a predetermined temperature parameter-correction factor relationship to adjust said control signal to set said quantum bit step amount to establish said bit accumulating period appropriately for said predetermined frequency; the apparatus further comprising a correlation base; said correlation base being coupled with said temperature sensing device and receiving a parameter of ambient temperature from said temperature sensing device; said correlation base establishing said temperature parameter-correction factor relationship; said correlation base being a correlation table relating said parameter of ambient temperature change with said correction factor.

16. An apparatus for generating a supply signal at a predetermined frequency, the apparatus comprising:

a digital synthesizing device;

an oscillator device connected with said digital synthesizer device;

a processing device connected with said digital synthesizer device; and a temperature sensing device connected with said processing device;

said oscillator device being connected with said digital synthesizing device and providing a periodic excitation signal to said digital synthesizing device; said digital synthesizing device responding to said excitation signal by recurrently accumulating bits in an accumulator device in quantum bit step amounts to a maximum bit capacity and returning to a starting bit count in a bit accumulating period; said digital synthesizing device generating said supply signal based upon said bit accumulating period; said processing device providing a control signal to said digital synthesizing device to control said quantum bit step amount; said temperature sensing device and said processor device cooperatively employing a predetermined temperature parameter-correction factor relationship to adjust said control signal to set said quantum bit step amount to establish said bit accumulating period appropriately for said predetermined frequency; the apparatus further comprising a correlation base; said correlation base being coupled with said temperature sensing device and receiving a parameter of ambient temperature from said temperature sensing device; said correlation base establishing said temperature parameter-correction factor relationship; said correlation base being a correlation algorithmic relation defining said correction factor as a function of said parameter of ambient temperature.

17. An apparatus for generating a supply signal at a predetermined frequency, the apparatus comprising:

a digital synthesizing device;

an oscillator device connected with said digital synthesizer device;

a processing device connected with said digital synthesizer device; and a temperature sensing device connected with said processing device;

said oscillator device being connected with said digital synthesizing device and providing a periodic excitation signal to said digital synthesizing device; said digital synthesizing device responding to said excitation signal by recurrently accumulating bits in an accumulator device in quantum bit step amounts to a maximum bit capacity and returning to a starting bit count in a bit accumulating period; said digital synthesizing device generating said supply signal based upon said bit accumulating period; said processing device providing a control signal to said digital synthesizing device to control said quantum bit step amount; said temperature sensing device and said processor device cooperatively employing a predetermined temperature parameter-correction factor relationship to adjust said control signal to set said quantum bit step amount to establish said bit accumulating period appropriately for said predetermined frequency; said temperature sensing device being connected with said processing device via a weighted combining device; said weighted combining device also being connected with said oscillator device; said weighted combining device weightingly combining temperature-parameter-indicating signals from said temperature sensing device and said oscillator device to determine a weighted indicator of said parameter of ambient temperature for use with said correlation base in cooperation with said processor device.

* * * * *